United States Patent [19]

Veendrick et al.

[11] Patent Number: 5,250,823
[45] Date of Patent: Oct. 5, 1993

[54] INTEGRATED CMOS GATE-ARRAY CIRCUIT

[75] Inventors: Hendrikus J. M. Veendrick; Andreas A. J. M. van den Elshout; Dirk W. Harberts, all of Eindhoven, Netherlands

[73] Assignee: U.S. Philips Corp., New York, N.Y.

[21] Appl. No.: 804,468

[22] Filed: Dec. 5, 1991

Related U.S. Application Data

[63] Continuation of Ser. No. 518,690, May 3, 1990, abandoned.

[30] Foreign Application Priority Data

Oct. 24, 1989 [NL] Netherlands .................. 8902629

[51] Int. Cl.$^5$ .................. H01L 27/104; H01L 29/76
[52] U.S. Cl. .................. 257/206; 257/204; 257/369
[58] Field of Search .................. 357/45, 42, 40; 257/204, 206, 369

[56] References Cited

U.S. PATENT DOCUMENTS

| | | | |
|---|---|---|---|
| 4,623,911 | 11/1986 | Pryor | 357/45 |
| 4,644,187 | 2/1987 | Haji | 357/45 |
| 4,716,308 | 12/1987 | Matsuo et al. | 357/45 |
| 4,764,798 | 8/1988 | Kawabata | 357/45 |
| 4,825,273 | 4/1989 | Arakawa | 357/45 |
| 5,038,192 | 8/1991 | Bonneau | 357/45 |
| 5,107,147 | 4/1992 | Yee et al. | 357/45 |

FOREIGN PATENT DOCUMENTS

| | | | |
|---|---|---|---|
| 0170268 | 2/1986 | European Pat. Off. | 357/45 |
| 0336741 | 10/1989 | European Pat. Off. | 357/45 |
| 58-122771 | 7/1983 | Japan | 357/45 |
| 60-153143 | 8/1985 | Japan | 357/45 M |
| 61-288464 | 12/1986 | Japan | 357/45 |
| 61-292936 | 12/1986 | Japan | 357/45 |
| 2143990 | 2/1985 | United Kingdom | 357/45 |

*Primary Examiner*—Rolf Hille
*Assistant Examiner*—Steven Loke
*Attorney, Agent, or Firm*—Steven R. Biren

[57] ABSTRACT

A gate array circuit includes a row of consecutively arranged n-channel transistors and an adjacent row of p-channel transistors. Both rows are composed of at least three subrows with two subrows of narrow transistors and one subrow of wide transistors, of which the channel width is at least three times the width of the narrow transistors. The gate electrodes are common to the three subrows. Preferably, the wide subrow is arranged centrally between the narrow subrows. This construction affords the advantage of a very high density and a very high flexibility in designing the functions to be realized.

3 Claims, 4 Drawing Sheets

INTEGRATED CMOS GATE-ARRAY CIRCUIT

This is a continuation of application Ser. No. 07/518,690, filed May 3, 1990, abandoned.

BACKGROUND OF THE INVENTION

The invention relates to an integrated CMOS circuit of the gate-array type comprising a semiconductor body provided at one surface with; a first row and an adjacent parallel second row of n-channel MOS transistors having common gate electrodes in the form of conductor tracks extending transverse to the row direction over both rows, and a first row and an adjacent parallel second row of p-channel MOS transistors having common gate electrodes in the form of conductor tracks extending transverse to the row direction over both rows. Such a device is known, for example, from U.S. Pat. No. 4,764,798.

Gate arrays offer, as is known, the possibility of keeping the period from design to manufacture of integrated circuits having a given function very short. The silicon wafers inclusive of the source and drain zones and the polysilicon generally used for the gate electrodes of the D- and p-channel MOS transistors arranged in a regular pattern are manufactured and then stored. When a given function has to be integrated on behalf of a customer, this function can be entirely implemented using the patterns of contact holes and wiring in one or more wiring layers. This means that the manufacturer need only carry out, with the wafers already available, the last stages of the manufacturing process (i.e. contact holes and wiring layers plus etching steps).

When ascertaining the size of the field effect transistors, more particularly the width thereof, a number of more or less conflicting requirements must be taken into account, which generally lead to a compromise, which is never entirely satisfactory. It should be noted that the width is to be understood to mean the dimension parallel to the surface transverse to the current direction of drain and source. For a ROM, very small transistors are sufficient, which have the advantage of a very high packing density. On the contrary, considerably larger transistors are required for given logic functions. Such transistors could be obtained in that transistors arranged consecutively in a row are connected in parallel. It has been found, however, that in practice this solution requires a very large amount of space and often strongly reduces the flexibility when designing a circuit having a given function.

The aforementioned U.S. Pat. No. 4,764,798 proposes to use instead of one row two adjacent rows of n-channel MOST's having common gate electrodes and two rows of p-channel field effect transistors having common gate electrodes. When, where desired, adjacent n-zones and p-zones, respectively, are connected to each other, transistors can be obtained having a two times larger width. Due to this configuration, a considerable increase in flexibility is obtained. It is possible more particularly to form p-channel transistors, whose channel width is two times the width of n-channel transistors, especially to compensate for the approximately two times lower mobility of holes with respect to electrons. However, in the case in which transistors are required whose channel widths have a ratio of more than 2, it is nevertheless necessary again in this configuration to connect transistors in a row in parallel.

SUMMARY OF THE INVENTION

The invention has as its object inter alia to provide a device of the gate array type having a configuration with which a higher flexibility is obtained, especially with regard to the channel width of the transistors, without or substantially without the amount of space being increased.

The invention is based on the recognition of the fact that this can be achieved by the use of rows of transistors having different channel widths.

An integrated circuit of the gate array type of the kind described above is characterized according to the invention in that beside the first and second rows of n-channel transistors and beside the first and second rows of p-channel transistors, respectively, (at least) one further row (designated as third row) of n-channel transistors and p-channel transistors, respectively, is arranged, which extends parallel to the first and second rows, the gate electrodes of the first and second rows of n-channel transistors at the same time constituting gate electrodes of the third row of n-channel transistors and the gate electrodes of the first and second rows of p-channel transistors at the same time constituting gate electrodes of the third row of p-channel transistors, while the transistors of the third row of n-channel transistors and p-channel transistors, respectively, have a width which is at least three times the width of the transistors of the first and second rows of n-channel transistors and p-channel transistors, respectively.

In the case, for example, in which the width of the transistors of the third row is three times the width of the transistors of the first and second rows, the effective transistor width can be varied by a factor 5, as can be verified in a simple manner, by connecting in parallel transistors in the three rows without it being necessary to use adjacent transistors in the same row. This increase in flexibility can be achieved substantially without enlargement of the surface area. By connecting two narrow transistors in the first and second rows in parallel, channel width ratios of 1:2 can be obtained in the same manner as described in the aforementioned US Patent.

A favorable embodiment of an integrated circuit according to the invention is characterized in that the width of the field effect transistors of the third row of n-channel transistors and of the third row of p-channel transistors, respectively, is about four times the width of the field effect transistors of the first and second rows of n-channel transistors and the first and second rows of p-channel transistors, respectively.

BRIEF DESCRIPTION OF THE DRAWING

The invention will be described more fully with reference to several embodiments and the accompanying diagrammatic drawing, in which.

It should be noted that the Figures are schematic and not drawn to scale.

DESCRIPTION OF THE PREFERRED EMBODIMENTS

Figure 1:
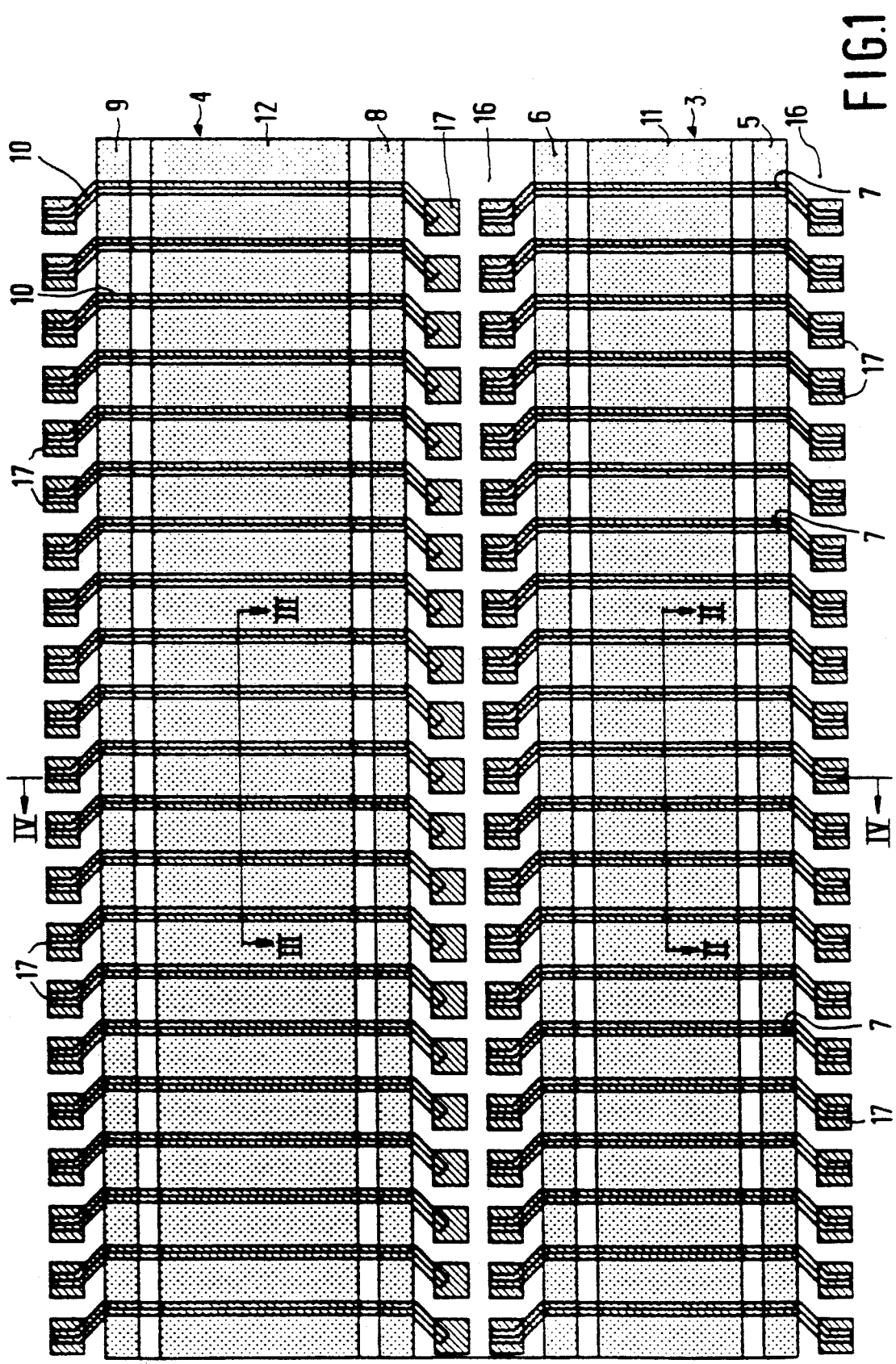
FIG. 1 is a plan view of a gate array before the wiring determining a function is provided.
Figure 3:
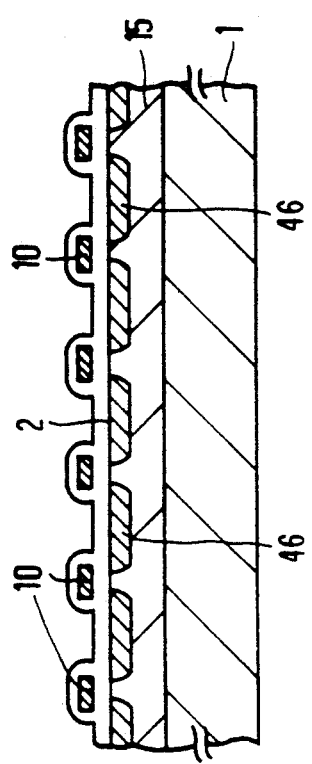
FIGS. 2, 3 and 4 show cross-sections of this circuit taken on the lines II—II, III—III and IV—IV, respectively, in FIG. 1.
Figure 2:
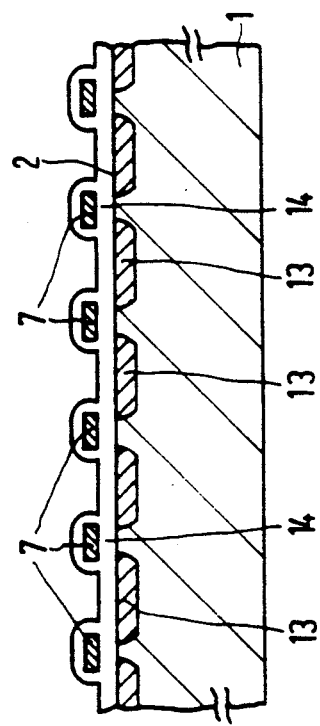
Figure 4:
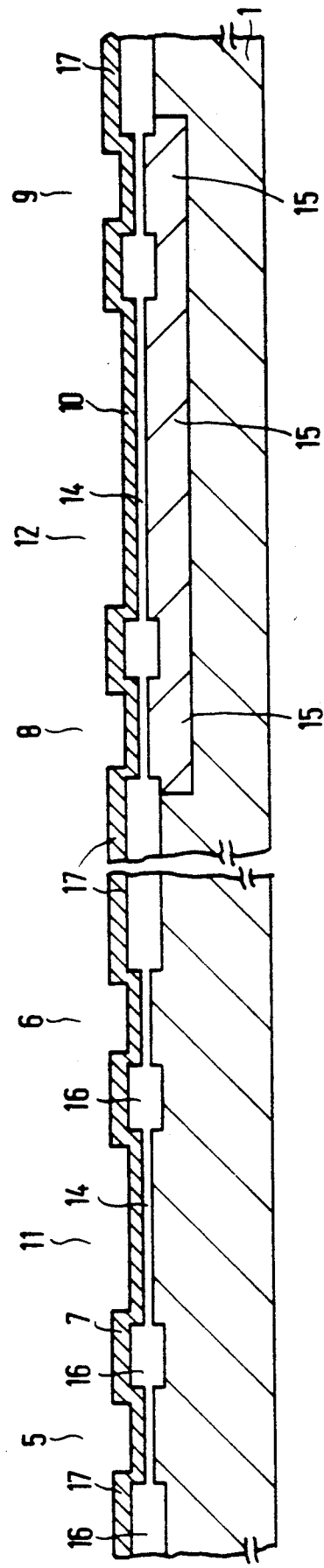

In the plan view of FIG. 1 and in the cross-sections of FIGS. 2, 3 and 4, a part of a gate array circuit is shown at the stage at which the transistors are formed in the semiconductor body and the device is ready for providing a specific function determined by the further wirings.

The device comprises a monocrystalline semiconductor body 1, which may be made of any suitable semiconductor material and in this case consists of silicon of, for example, the p-conductivity type. The body 1 is provided at its surface 2 with a system 3 of n-channel transistors and a system 4 of p-channel transistors. The system 3 comprises a first row 5 and a second row 6 parallel thereto of n-channel field effect transistors having common gate electrodes 7, which extend at right angles to the row direction of both rows 5 and 6. In an analogous manner, the system 4 comprises a first row 8 and a second row 9 of p-channel field effect transistors having common gate electrodes 10. The n-channel transistors of the rows 5 and 6 have equal or at least substantially equal channel widths Wn. The p-channel transistors of the rows 8 and 9 also have equal or at least substantially equal channel widths Wp.

According to the invention, the systems 3 and 4 comprise beside the said rows each a further third row 11 and 12 of n-channel transistors and p-channel transistors, respectively, whose width is at least three times Wn and Wp, respectively. The gate electrodes 7 and 10 at the same time constitute the gate electrodes of the n-channel transistors 11 and the p-channel transistors 12, respectively.

As appears from the cross-section of FIG. 2, the n-channel transistors of a row comprise a series of adjacent n-type zones 13. The parts of the p-type substrate between the zones 13 constitute the channel regions, which are separated by the thin oxide layer 14 constituting the gate dielectric from the gate electrodes 7. In this configuration, a transistor can be formed in that a gate electrode 7 and the n-zones 13 located on the lefthand and righthand side of this electrodes are suitably connected to each other. This transistor may be insulated, if necessary or desired, in that the adjacent gate electrodes are applied to a sufficiently low potential (gate isolation).

The rows of p-channel transistors comprise an n-zone 15, which is formed in the p-substrate 1 and is designated as "pocket" or "well" (FIG. 3). In the zone 15, a series of p-type surface zones 46 are provided, which can constitute transistors in the same manner as the zones 13 together with the intermediate parts of the n-type zone 15 constituting the channels with the gates 10. The insulation between the channel transistors can be obtained in that adjoining gate electrodes 10 are applied to a high positive voltage.

The channel widths of the n-channel and p-channel transistors are illustrated diagrammatically in FIG. 4, in which a sectional view of the circuit is shown along a gate electrode 7 and a gate electrode 10 in line therewith. The lefthand half of FIG. 4 shows a sectional view of the system of n-channel transistors. At the center, the row 11 is located comprising field effect transistors having a comparatively large channel width. On either side of the row 11, the rows 5 and 6 are located comprising transistors having a comparatively small channel width. In the same manner, in the righthand half of FIG. 4 the wide p-channel transistors of the row 12 at the center and all p-channel transistors of the rows 8 and 9 are shown.

As will further appear from FIG. 4, the regions in which the rows 5, 6, 8, 9, 11 and 12 are located are laterally bounded by comparatively thick field oxide 16, which is partly sunken into the substrate 1 and has a considerably larger thickness than the gate dielectric 14. On the field oxide 16 (FIG. 1) are disposed contact surfaces 17 of the gate electrodes 7 and 10, at which connections with other wiring lines to be provided later can be formed.

It should be noted that for the system 4 of p-channel transistors for the rows of transistors a common n-type pocket 15 is provided. The three rows 8, 9 and 12 may also be provided, however, if desired, each in a separate pocket 15.

The widths of the rows 11 and 12 is at least three times larger than that of the rows 5, 6 and 8, 9, respectively, as a result of which, as already stated above, a wide choice in effective widths is possible. In a particular embodiment, the width of the rows 5, 6, 8 and 9 was about 2 $\mu$m, while the width of the row 11 was about 9 $\mu$m and that of the row 12 was about 12 $\mu$m, as a result of which an even larger ratio in channel widths is possible.

Figure 5:
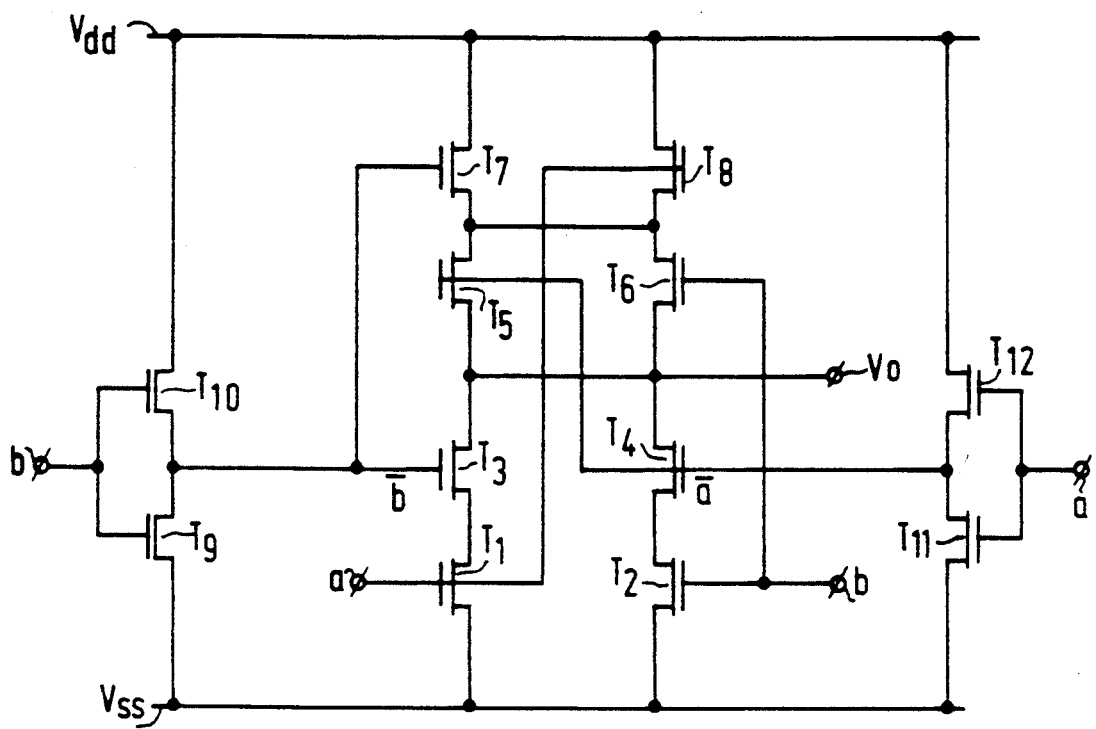
FIG. 5 shows the circuit diagram of an EXCLUSIVE NOR gate (EXC.NOR)
Figure 6:
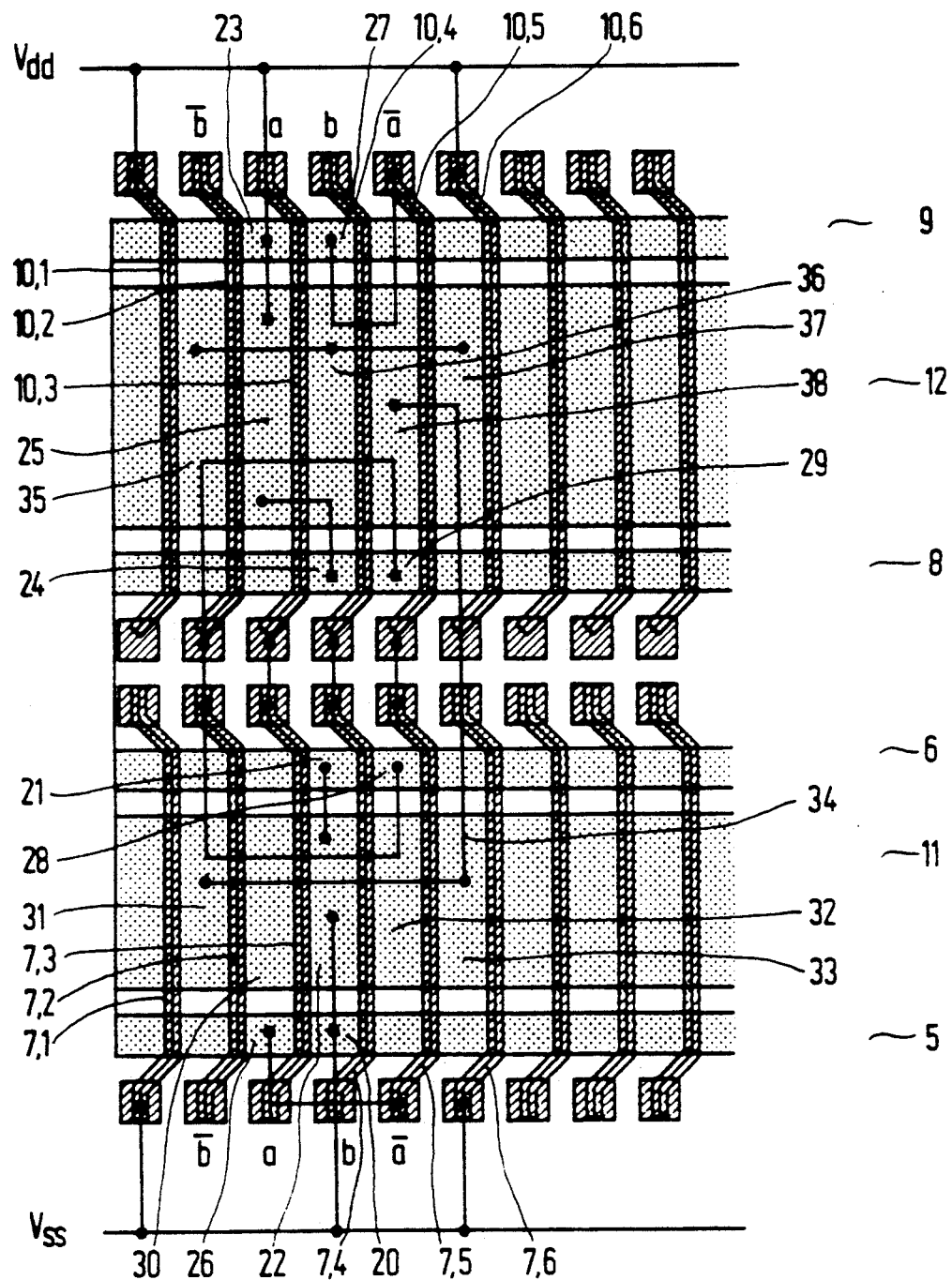
FIG. 6 shows diagrammatically the embodiment of this gate in the gate array of FIG. 1.

With reference to FIGS. 5 and 6, by way of example the manufacture of a so-called Exclusive NOR circuit will be described. FIG. 5 shows the circuit diagram of the circuit which has, by way of example, two input terminals. The input signals are indicated by a and b, while the inverse signals are indicated by a and b, respectively. The circuit comprises four n-channel transistors T1, T2, T3 and T4 and four p-channel transistors T5, T6, T7 and T8. The supply line (for example 5 V) is designated by Vdd, while Vss indicates the ground line. The transistors T1, T3, T5 and T7 constitute a first series branch between Vdd and Vss and the transistors T2, T4, T6 and T8 constitute a second series branch. The drain zones of T7 and T8 are interconnected. The drain zones of T5 and T6 are connected to each other and also to the output terminal Vo. The drain zones of T3 and T4 are also connected to Vo. The input signal a is applied to the gates of T1 and T8, while the input signal b is applied to the gates of T2 and T6. The inverse signals a and b are applied to the gates of T4 and T5 and to the gates of T3 and T7, respectively.

It is easy to show that, when the input signals a and b are equal, i.e. are both at the same time "1" or "0", the output signal Vo is high (5 V) and that in the other situations the output signal is low (EXCL.-NOR).

Two inverters are required to form the various signals a and b. The inverter for the signal b comprises an n-channel transistor T9 and a p-channel transistor T10. The source zones of T9 and T10 are connected to Vss and to Vdd, respectively. The drain zones of T9 and T10 are connected to the gate electrodes of T3 and T7. The input signal b is supplied to the gate electrodes of T9 and T10. The output signal b is derived at the drain zones of T9 and T10 and is supplied to the gate electrodes of T3 and T7. In an analogous manner, the input signal a is inverted by means of the inverter T11, T12, T11 being an n-channel transistor and T12 being a p-channel transistor.

The dimensions of the transistors T9 and T12 can be very small because the inverters are substantially not loaded. The transistors T1-T8 on the contrary are chosen to be considerably larger.

FIG. 6 shows a possible embodiment of the circuit according to FIG. 5, which embodiment is very compact due to the combination of one row of wide transistors and two rows of narrow transistors. In FIG. 6, the wirings are simply indicated by a broken line. Where connections cross each other, they can be formed in two different wiring layers electrically insulated from each other. In the embodiment described here, two wiring layers are sufficient besides the aforementioned polycrystalline silicon layer, in which the gate electrodes are formed. Contacts between the wiring layers and zones or gate electrodes are indicated by a dot.

On the lower side and the upper side of the drawing, two lines are shown, which are used as ground line Vss and as supply line Vdd, respectively.

The ground line Vss is connected to the gates 7,1 and 7,6 of the system of n-channel transistors. Under these gates, no conducting channels can be formed, as a result of which an effective electrical insulation between the circuit and adjacent circuits is obtained. In order to also insulate the circuit in the system of p-channel transistors, the supply line Vdd is connected to the gates 10,1 and 10,6. Further, the gate 7,2 is connected to the gate 10,2, while the gate 7,3 is connected to the gate 10,3 and gates 7,4 and 7,5 are connected to the gates 10,4 and 10,5 respectively. The input signals a and b are supplied, for example, via signal lines (not shown in the drawing) to the gates 7,3/10,3 and 7,4/10,4, respectively. The potential Vss is applied to the n-type zones 20 and 21 of the narrow rows of n-channel transistors and to the n-zone 22 of the wide row of n-channel transistors. The potential Vdd is applied to the p-type zones 23, 24 of the narrow rows of p-channel transistors and to the p-type zone 25 of the wide central row. The n-channel transistor T11 is constituted by the gate 7,3, the narrow D-type zone 20 constituting the source zone and the narrow n-type zone 26 constituting the drain zone. The zone 26 is connected via the gates 7,5 and 10,5 to the p-type zone 27 in the row 9. This zone constitutes the drain of the p-channel transistor T12, whose gate is constituted by the electrode 10,3 and whose source is constituted by the p-type zone 23. The n-channel transistor T9 is located in the narrow row 6 and comprises the gate 7,4 and the n-type zones 21 and 28 constituting the source and the drain, respectively. The zone 28 supplying the inverted signal b is connected to the gate electrodes 7,2 and 10,2 and to the p-type zone 29 in the narrow row 8. The zone 29 is the drain zone of the p-channel transistor T10, whose gate is constituted by the gate 10,4 and whose source is constituted by the p-type zone 24.

For the n-channel transistors T1-T4, the n-type zones in the wide row 11 are used, while for the p-channel transistors T5-T8 the p-type zones in the wide row 12 are used. Thus, the n-channel transistor T1 comprises the D-type zone 22 as source, the n-type zone 30 as drain and the gate electrode 7,3, to which the signal a is applied. The zone 30 at the same time constitutes the source of the n-channel transistor T3 having the gate 7,2 for the signal b and the n-type zone 31 as drain. The n-channel transistor T2 comprises the source zone 22, the gate 7,4 and the drain zone 32. The latter zone constitutes at the same time the source of the n-channel transistor T4, whose gate electrode comprises the gate 7,5 and whose drain is constituted by the D-type zone 33. The drain zones 31 and 33 are interconnected by means of the connection 34, which may be connected to the output terminal Vo for deriving the output signal.

The p-channel transistor T7 comprises as its source the (wide) p-type zone 25, the gate electrode 10,2 and as its drain zone the p-type zone 35. The p-channel transistor T8 also comprises as its source the zone 25, the gate electrode 10,3 and as its drain the p-type zone 36. The drain zones 35 and 36 of the parallel-connected transistors T7 and T8 are connected to each other and to the p-type zone 37, which constitutes the source zone of the p-channel transistor T5. The gate electrode of T5 is constituted by the gate 10,5 (signal a) and the drain zone is constituted by the p-type zone 38. This zone constitutes at the same time the drain zone of the p-channel transistor T6, which has the gate electrode 10,4 and whose source zone is constituted by the p-type zone 36. The zone 38 is connected to the connection 34, from which an output signal Vo can be derived.

Due to the combination both in the p-channel region and in the n-channel region of two very narrow rows of transistors and one very wide row, a very compact structure can be obtained, in which the required amount of space is mainly determined by the—wide—transistor T1-T8. The four transistors T9-T12 required for inverting the input signals a and b substantially do not require addition space.

Although it is possible to arrange the narrow rows 5/6 and/or 8/9 beside each other, the configuration described here, in which the narrow rows are located on either side of the wide rows, offers additional advantages due to high flexibility in designing the circuit.

It will be appreciated that the invention is not limited to the embodiment given here, but that within the scope of the invention many further variations are possible for those skilled in the art. For example, both in the n-channel region and in the p-channel region more than the three said rows may be arranged, as the case may be having the width of the narrow rows. Instead of the Exclusive NOR circuit, also other logic gates and/or memory circuits in the gate array described here may be mentioned.

We claim:

1. An integrated CMOS circuit of the gate array type having a semiconductor body provided at a surface and comprising:

a first row and an adjacent parallel second row of n-channel MOS transistors having common gate electrodes in the form of conductor tracks extending transverse to the row direction over both rows;

a first row and an adjacent parallel second row of p-channel MOS transistors having common gate electrodes in the form of conductor tracks extending transverse to the row direction over both rows;

characterized in that between the first and second rows of n-channel transistors and between the first and second rows of p-channel transistors, respectively, at least one further row of n-channel transistors and at least one further row of p-channel transistors, respectively, is provided, which extend parallel to the first and second rows, the gate electrodes of the first and second rows of n-channel transistors constituting gate electrodes of the at least one further row of n-channel transistors and the gate electrodes of the first and second rows of p-channel transistors constituting gate electrodes of the at least one further row of p-channel transistors, while the transistors of the at least one further row of n-channel transistors and p-channel transistors, respectively, have a width which is at least three times the width of the transistors of the first and second rows of n-channel transistors and p-channel transistors, respectively, the width of the transistors of the first and second rows of n-channel transistors being equal, and the width of the transistors of the first and second rows of p-channel transistors being equal.

2. An integrated circuit as claimed in claim 1, characterized in that the width of the field effect transistors of the at least one further row of n-channel transistors and of the at least one further row of p-channel transistors, respectively, is at least about four times the width of the field effect transistors of the first and second rows of n-channel transistors and the width of the first and second rows of p-channel transistors, respectively.

3. An integrated circuit as claimed in claim 1 or 2, characterized in that the at least one further row of n-channel transistors and at least one further row of p-channel transistors, respectively, is located symmetrically between the first and the second row of n-channel transistors and between the first and the second row of p-channel transistors, respectively.

* * * * *